United States Patent [19]

Man

[11] Patent Number: 5,533,635
[45] Date of Patent: Jul. 9, 1996

[54] METHOD OF WAFER CLEANING AFTER METAL ETCH

[75] Inventor: Chiu-Kwan Man, Astrid Meadow, Singapore

[73] Assignee: Chartered Semiconductor Manufacturing Pte. Ltd., Singapore, Singapore

[21] Appl. No.: 320,894

[22] Filed: Oct. 11, 1994

[51] Int. Cl.$^6$ ............................................ H01L 21/3065
[52] U.S. Cl. .................... 216/67; 156/643.1; 156/646.1; 216/75; 216/77; 216/79
[58] Field of Search .......................... 156/643.1, 646.1; 216/67, 79, 75, 77

[56] References Cited

U.S. PATENT DOCUMENTS

| | | | |
|---|---|---|---|
| 4,267,013 | 5/1981 | Iida et al. | 216/67 |
| 4,285,763 | 8/1981 | Coldren | 156/646.1 |
| 4,325,984 | 4/1982 | Calfo et al. | 216/67 |
| 4,351,696 | 9/1982 | Radigan | 156/646.1 |
| 4,547,260 | 10/1985 | Takada et al. | 156/646.1 |
| 4,692,205 | 9/1987 | Sachdev et al. | 156/646.1 |
| 4,962,049 | 10/1990 | Chang et al. | 437/13 |
| 4,985,113 | 1/1991 | Fujimoto et al. | 156/643.1 |

Primary Examiner—T. Tung
Attorney, Agent, or Firm—George O. Saile; Larry J. Prescott

[57] ABSTRACT

This invention provides a method for converting residual chlorine, remaining after using a chlorine specie etchant to etch metal electrodes in an integrated circuit device, to a stable polymer thereby eliminating any possibility for residual chlorine to cause corrosion of the metal electrodes. In conventional processing residual chlorine ions can combine with moisture and cause immediate corrosion of metal electrodes or can cause corrosion over time resulting in a degradation of device reliability. This invention provides a method of baking the integrated circuit device in an atmosphere of $CF_4$, $O_2$, or $CF_4$ and $O_2$ at elevated temperature, thereby converting any residual chlorine to a stable polymer. Since all the available chlorine is stabilized free chlorine is no longer available as a corrosion hazard.

16 Claims, 3 Drawing Sheets

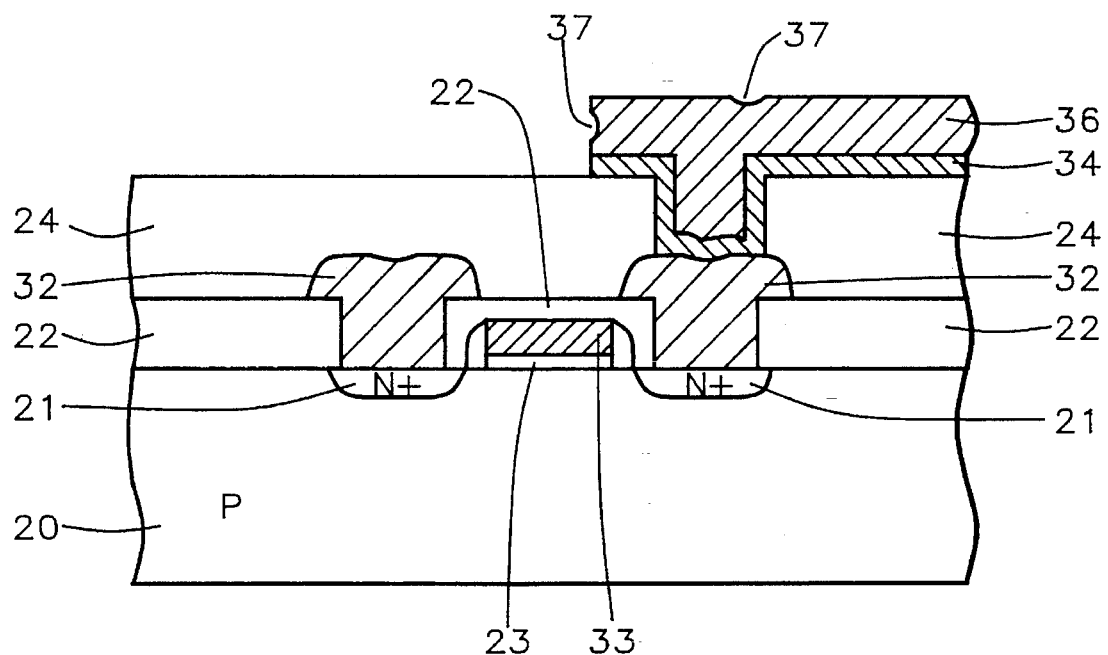
*FIG. 1 - Prior Art*
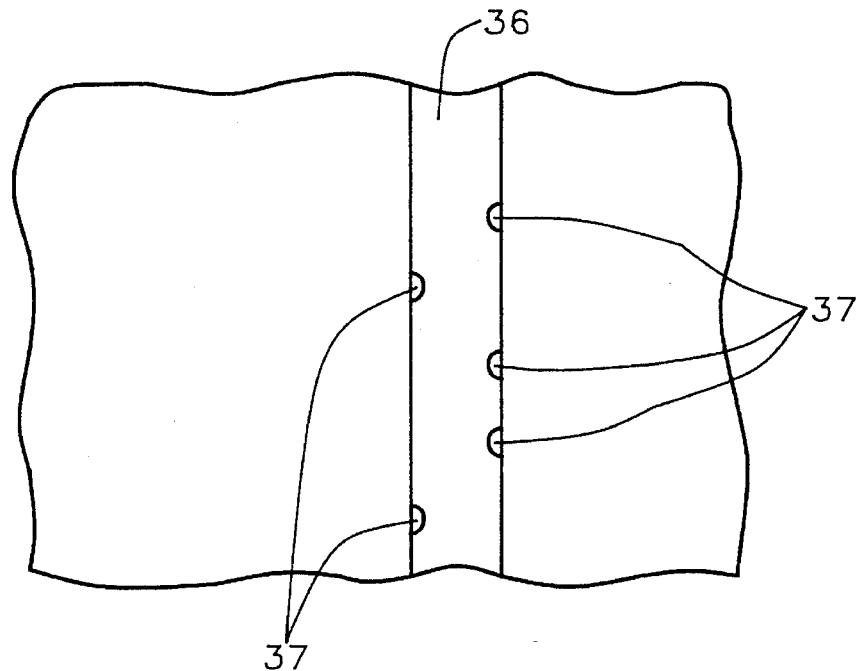
*FIG. 2 - Prior Art*

METHOD OF WAFER CLEANING AFTER METAL ETCH

BACKGROUND OF THE INVENTION

(1) Field of the Invention

This invention relates to a novel method of cleaning integrated circuit wafer after metal etch. After metal etch residual chlorine ions which are not completely removed during wafer cleaning can combine with water and cause metal corrosion. This invention provides a method to passivate the chlorine ions before wafer cleaning by converting them to a stable polymer. The chlorine is then stripped off during the photoresist cycle and a wet organic cleaning cycle.

(2) Description of the Related Art

Conventional processing of integrated circuit wafers requires metal etch with a chlorine species etchant. The photoresist is then stripped using a $CF_4$ and $O_2$ plasma followed by an $O_2$ strip and a water rinse. At a low percent $CF_4$ this method will not convert all available chlorine ions to fluorine ions leaving residual chlorine ions. When the residual chlorine ions contact water during the water rinse they will cause corrosion of the metal electrodes. At a high percent $CF_4$ the $CF_4/O_2$ mixture will etch the barrier metal causing undercutting and a metal lifting problem. Wet organic cleaning is very effective in removing chlorine ions and polymers but the chlorine level must be low enough so that the water rinse will not cause corrosion pits, often called mousebites during the rinse step. The corrosion can also proceed slowly and lead to a serious reliability problem.

Adequate cleaning of integrated circuit wafers after intermediate and final process steps is of great importance in semiconductor processing. U.S. Pat. No. 4,962,049 to Chang et al uses plasma oxygen to remove impurities, such as moisture, occluded gases, etc. from the wafer. This patent is particularly concerned with the back side of the wafer. Residual chlorine has long been recognized as a key problem in wafer cleaning due to the corrosive nature of chlorine in the presence of moisture.

SUMMARY OF THE INVENTION

It is the principle object of this invention to provide a method to convert residual chlorine, left after using a chlorine specie etchant to etch metal patterns on an integrated circuit wafer, to a stable polymer which can be stripped off during the photoresist stripping cycle and organic cleaning cycle.

This objective is achieved by placing the integrated circuit wafer in a stabilizing atmosphere of essentially $O_2$, $CF_4$, or $O_2$ and $CF_4$ at a temperature of between about 150° C. and 250° C. for about 60 seconds with no plasma discharge present after etching the metal electrode pattern and before the photoresist is stripped. Exposure to this stabilizing atmosphere converts the residual chlorine to a stable polymer. This reaction binds all the residual chlorine and prevents any free chlorine ions from corrosively reacting with the metal. After converting the chlorine to a stable polymer the chlorine and the photoresist are stripped together using a conventional stripping process such as a $CF_4$ and $O_2$ plasma followed by an $O_2$ strip followed by a deionized water rinse. It is important that the conversion of the chlorine to a stable polymer take place in an $O_2$, $CF_4$, or $O_2$ and $CF_4$ environment at elevated temperature with no plasma present. If a plasma discharge is present the reaction will compete with the stripping process and free chlorine will be left on the integrated circuit wafer.

Conventional processing after etching the metal electrode pattern with a chlorine specie etchant has been to use a $CF_4$ and $O_2$ plasma followed by an $O_2$ strip followed by a de-ionized water rinse to remove the photoresist and residual chlorine. At a low percent $CF_4$ this method will not convert all available chlorine ions to fluorine ions leaving residual chlorine ions. When the residual chlorine ions contact water during the water rinse they will cause corrosion of the metal electrodes. At a high percent $CF_4$ the $CF_4/O_2$ mixture will etch the barrier metal causing undercutting and a metal lifting problem. Wet organic cleaning is very effective in removing chlorine ions and polymers but the chlorine level must be low enough so that the water rinse will not cause corrosion pits, often called mousebites during the rinse step.

A number of integrated circuit device samples have been fabricated under controlled conditions wherein some samples were fabricated using the stabilizing atmosphere of this invention while others were fabricated using conventional processing only without the stabilizing atmosphere. The samples fabricated using the stabilizing atmosphere showed no signs of corrosion while the samples fabricated using conventional processing only without the stabilizing atmosphere showed evidence of corrosion.

FIG. 1 and FIG. 2 show the result of using conventional processing only without the stabilizing atmosphere. FIG. 1 shows a cross section of an integrated circuit device formed on a silicon substrate 20 having a barrier metal pattern 34 and an electrode pattern 36 where pockets of corrosion 37 have formed in the electrode metal. FIG. 2 shows a top view of the metal electrode 36 with the pockets of corrosion 37, which are often referred to as mousebites because of their shape.

BRIEF DESCRIPTION OF THE DRAWINGS

FIG. 1 is a cross section of the integrated circuit device, using conventional processing, after removal of the photoresist showing corrosion of the metal electrode.

FIG. 2 is a top view of a portion of the metal electrode, formed using conventional processing, showing corrosion of the electrode.

DESCRIPTION OF THE PREFERRED EMBODIMENT

Figure 3:
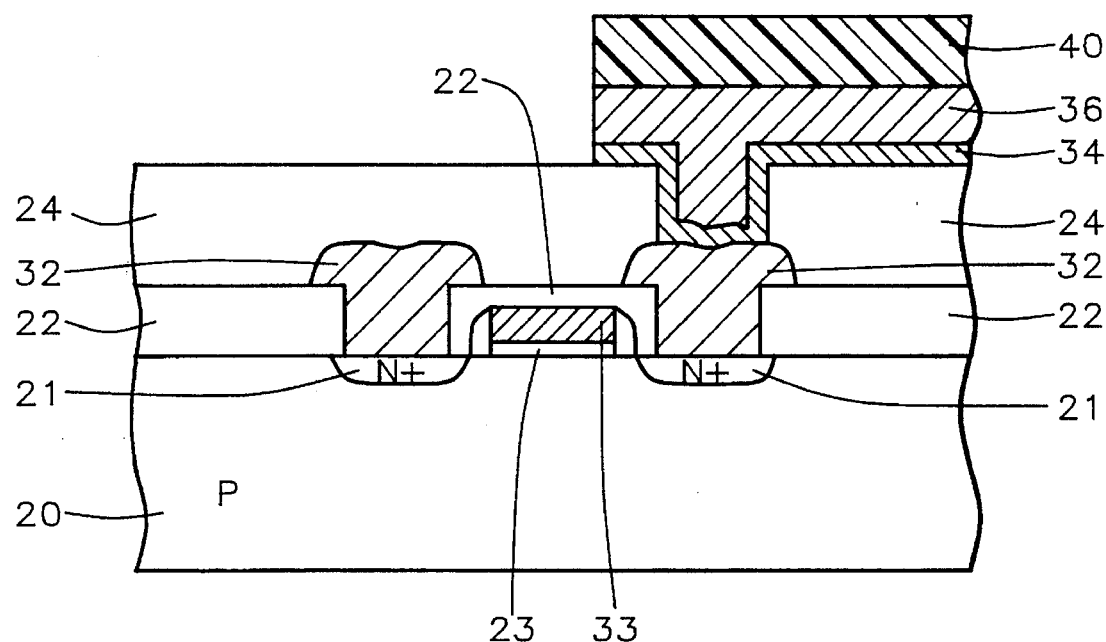
FIG. 3 is a cross section of the integrated circuit device prior to removal of the photoresist after the metal electrode pattern has been etched.
Figure 4:
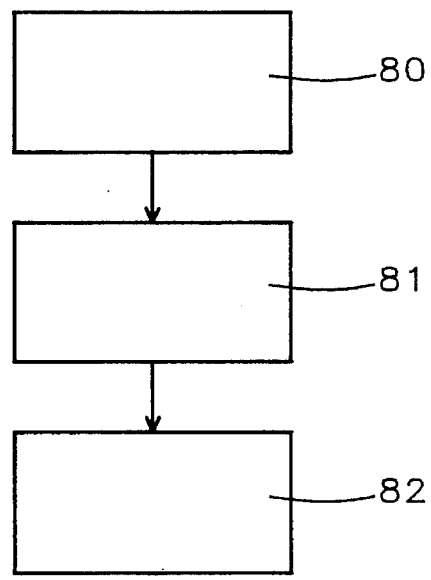
FIG. 4 is a process flow diagram of the current invention.
Figure 5:
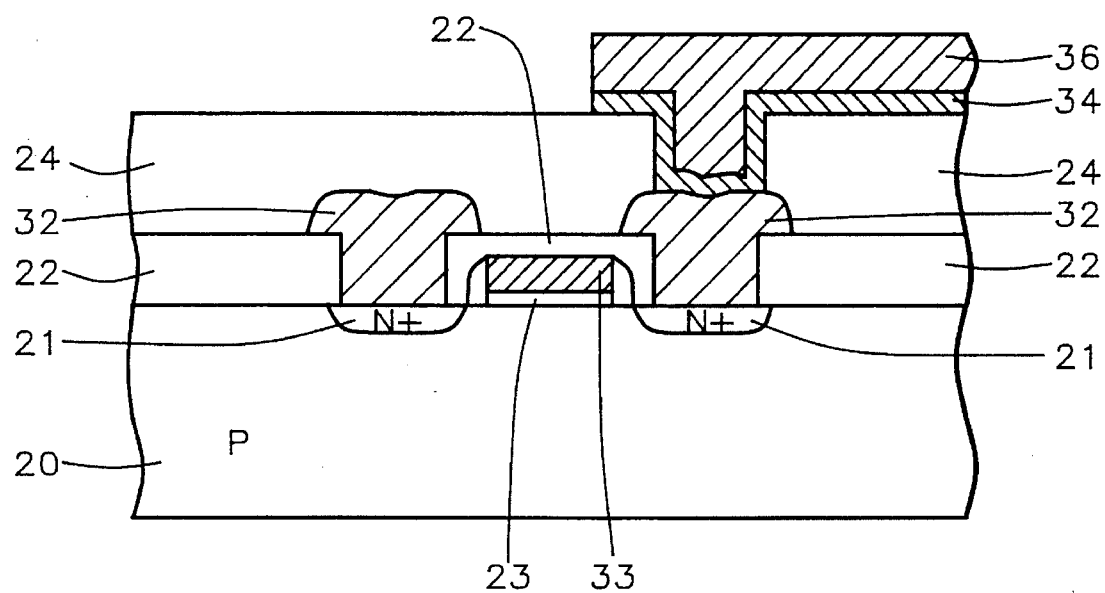
FIG. 5 is a cross section of the integrated circuit device, using the process of this invention, after removal of the photoresist showing no corrosion of the metal electrode.

Refer now to FIG. 3, FIG. 4, and FIG. 5, there is shown an embodiment of the current invention. FIG. 3 shows a cross section of an integrated circuit device formed on a silicon substrate 20 having source and drain regions 21, a polysilicon gate electrode 33, a gate oxide 23, polysilicon contacts 32, dielectric layers 22 and 24, a TiW barrier metal pattern 34, an electrode pattern 36 of aluminum or an alloy of aluminum, and a patterned layer of photoresist 40. The particular device example shown in FIG. 3 and FIG. 5 is an N channel metal oxide semiconductor field effect transistor, or MOSFET. This invention works equally well for P channel MOSFET devices, bi-polar devices, etc. as the invention relates to cleaning integrated circuit wafers after metal etching. FIG. 4 shows a flow diagram for the key process steps of the invention. Conventional processing of the integrated circuit device is followed until the first element of the process flow diagram 80 where the electrode pattern is formed in the aluminum 36 and in the TiW barrier metal 34 by etching with a chlorine specie etchant such as $Cl_2$ and/or $BCl_3$.

Next, as indicated in the next element of the process flow diagram 81, the integrated circuit device is baked in a stabilizing atmosphere composed essentially of $O_2$, $CF_4$, or $O_2$ and $CF_4$ at a temperature of between about 150° C. and 250° C. for between about 5 and 60 seconds with no plasma discharge present. During the baking the residual chlorine is converted to a stable polymer. The baking time is sufficient to convert all the residual chlorine to a stable polymer so there are no longer chlorine ions available for corrosion even in the presence of moisture.

Next, as indicated in the next element of the process flow diagram 82, the integrated circuit device is placed in a plasma using $CF_4$ and $O_2$, followed by $O_2$ strip, followed by a rinse in de-ionized water with a temperature of between about 25° C. and 85° C., followed by an organic cleaning cycle. This will remove the photoresist, the stabilized chlorine, and any other organics which may be present. FIG. 5 shows a cross section of the integrated circuit device fabricated using the stabilizing atmosphere of the current invention showing no evidence of corrosion in the metal electrode 36 or in the barrier metal 34.

While the invention has been particularly shown and described with reference to the preferred embodiments thereof, it will be understood by those skilled in the art that various changes in form and details may be made without departing from the spirit and scope of the invention.

What is claimed is:

1. A method for cleaning chlorine from semiconductor integrated circuit wafers, comprising the steps of:

providing a semiconductor integrated circuit wafer;

providing a dielectric layer on said integrated circuit wafer;

providing a layer of metal on said dielectric layer;

providing a patterned layer of photoresist on said metal layer;

forming a patterned layer of metal covered by said patterned layer of photoresist by etching said metal not covered by said patterned layer of photoresist using a chlorine specie etchant, thereby forming residual chlorine;

baking said residual chlorine by exposing said patterned layer of metal covered by said patterned layer of photoresist to a first atmosphere at a temperature of between about 150° C. and 250° C. for a bake time with no plasma discharge present thereby converting said residual chlorine to a stable polymer; and stripping said photoresist and said baked residual chlorine using a $CF_4$ and $O_2$ plasma for a first time, followed by an $O_2$ strip for a second time, followed by rinsing in de-ionized water at a first temperature for a third time, followed by an organic cleaning cycle.

2. The method of claim 1 wherein said first atmosphere consists essentially of $O_2$.

3. The method of claim 1 wherein said first atmosphere consists essentially of $CF_4$.

4. The method of claim 1 wherein said first atmosphere consists essentially of $CF_4$ and $O_2$.

5. The method of claim 1 wherein said bake time is between about 5 and 60 seconds.

6. The method of claim 1 wherein said first time is between about 5 and 30 seconds.

7. The method of claim 1 wherein said second time is between about 30 and 180 seconds.

8. The method of claim 1 wherein said first temperature is between about 20° C. and 80 ° C.

9. The method of claim 1 wherein said third time is between about 20 and 60 seconds.

10. The method of claim 1 wherein said layer of metal is comprised of a layer of conducting metal formed on a layer of barrier metal.

11. The method of claim 10 wherein said barrier metal is TiW.

12. The method of claim 10 wherein said conducting metal is aluminum.

13. The method of claim 10 wherein said conducting metal is an alloy of aluminum.

14. The method of claim 1 wherein said chlorine specie etchant is $Cl_2$.

15. The method of claim 1 wherein said chlorine specie etchant is $BCl_3$.

16. The method of claim 1 wherein said chlorine specie etchant is $Cl_2$ and $BCl_3$.

* * * * *